US008954773B2

(12) United States Patent
Scott et al.

(10) Patent No.: US 8,954,773 B2
(45) Date of Patent: Feb. 10, 2015

(54) ELECTRONIC DEVICE AND METHOD FOR CONTROLLING CURRENT OF A PROCESSOR LOAD BY SLEWING CLOCK FREQUENCY

(75) Inventors: Jenifer M. Scott, Aberdeen (GB); Michael R. Garrard, Jaywick (GB); Ray C. Marshall, Harpenden (GB)

(73) Assignee: Freescale Semiconductor, Inc., Austin, TX (US)

( * ) Notice: Subject to any disclaimer, the term of this patent is extended or adjusted under 35 U.S.C. 154(b) by 2031 days.

(21) Appl. No.: 12/091,034

(22) PCT Filed: Oct. 21, 2005

(86) PCT No.: PCT/EP2005/011345
§ 371 (c)(1),
(2), (4) Date: Mar. 21, 2012

(87) PCT Pub. No.: WO2007/045265
PCT Pub. Date: Apr. 26, 2007

(65) Prior Publication Data
US 2008/0301478 A1    Dec. 4, 2008

(51) Int. Cl.
*G06F 1/26* (2006.01)
*H03L 7/08* (2006.01)
*G06F 1/08* (2006.01)
*H03L 7/197* (2006.01)

(52) U.S. Cl.
CPC .. *G06F 1/08* (2013.01); *G06F 1/26* (2013.01); *G06F 2203/014* (2013.01); *H03L 7/0802* (2013.01); *H03L 7/1974* (2013.01); *H03L 7/197* (2013.01)

USPC ............ 713/322; 713/300; 713/323; 713/330

(58) Field of Classification Search
USPC .................................. 713/300, 322, 323, 330
See application file for complete search history.

(56) References Cited

U.S. PATENT DOCUMENTS

| | | | |
|---|---|---|---|
| 5,822,596 A | 10/1998 | Casal et al. | |
| 5,964,881 A * | 10/1999 | Thor | 713/501 |
| 6,223,297 B1 * | 4/2001 | Inoue | 713/501 |
| 2002/0083354 A1 * | 6/2002 | Adachi | 713/322 |
| 2002/0140463 A1 | 10/2002 | Cheung | |
| 2003/0020442 A1 | 1/2003 | Hwang | |
| 2003/0076079 A1 | 4/2003 | Alcantar et al. | |
| 2003/0156438 A1 | 8/2003 | Neild et al. | |
| 2004/0057324 A1 * | 3/2004 | Abe et al. | 365/232 |
| 2004/0073821 A1 | 4/2004 | Naveh et al. | |
| 2004/0103330 A1 * | 5/2004 | Bonnett | 713/322 |
| 2004/0199799 A1 * | 10/2004 | Flynn | 713/300 |
| 2005/0144492 A1 * | 6/2005 | Yun et al. | 713/300 |
| 2005/0168290 A1 * | 8/2005 | Parikh | 331/16 |
| 2005/0188235 A1 * | 8/2005 | Atkinson | 713/330 |
| 2006/0145776 A1 * | 7/2006 | Shi et al. | 331/175 |
| 2006/0267645 A1 * | 11/2006 | Gonzalez et al. | 327/156 |
| 2007/0001697 A1 * | 1/2007 | Dobberpuhl et al. | 324/763 |
| 2007/0168686 A1 * | 7/2007 | Pessolano | 713/500 |

* cited by examiner

*Primary Examiner* — Vincent Tran

(57) ABSTRACT

An electronic device comprises a voltage regulator supplying a current to a load such as a micro-controller unit. The load controls the current provided to the load from the voltage regulator. Preferably, the load controls the level of current supplied to the load upon start-up, thereby avoiding power surges being drawn by the load.

19 Claims, 3 Drawing Sheets

ELECTRONIC DEVICE AND METHOD FOR CONTROLLING CURRENT OF A PROCESSOR LOAD BY SLEWING CLOCK FREQUENCY

FIELD OF THE INVENTION

This invention relates to an electronic device and a method for controlling a current. The invention is applicable to, but not limited to, initialising a micro-computer unit (MCU) by adjusting a clock frequency to control the current drawn by the MCU.

BACKGROUND OF THE INVENTION

Many known electronic devices utilise embedded micro-controller units (MCUs). Embedded micro-controllers are highly complex devices and typically use a significant amount of current in controlling the operation and functionality of the highly complex device that they are used in. In particular, it is known that a surge of activity is produced upon start-up of the device, which generates a large current transient. This, in turn, has been known to cause the MCU to operate outside of its desired specification.

An example of a large current transient of the MCU, created upon 'turn-on' of the electronic device, is illustrated in the waveform 100 of FIG. 1. The waveform 100 illustrates current 105 versus time 110. The sequence of events depicted represents initial power up, running of configuration ('boot loader') code including selection of final operating frequency, establishing clocks at the appropriate frequency and finally operation of the MCU using the aforementioned clocks. These events are described in detail below.

Initially, the MCU current increases 115 due to the PLL-locking and the boot loader running, as known to those skilled in the art. Typically a microcontroller is able to use a multitude of crystal oscillators, with a limitation of having only one maximum frequency. Therefore the multiplier required to create the maximum frequency from the crystal frequency is not fixed for the MCU. When power is first applied, the MCU will begin operation using a conservative multiplier, and thus at a conservative frequency. This is shown as 115 in FIG. 1.

Typically one of the tasks of the boot loader is to set the desired multiplier to achieve a maximum MCU operating frequency. Once a corresponding boot-loader operation has begun 115 (as known to those skilled in the art in initialising operation of processors and controllers), thereby creating an initial power surge, a short reduction in the current requirements of the micro controller unit (MCU) occurs.

This occurs during a 'reset' stage, whilst the MCU establishes the new multiplier, and hence the new operating frequency. The device multiplying the crystal frequency up to the maximum operating frequency—typically a Phase Lock Loop (PLL)—might overshoot the target maximum frequency. To avoid over speeding the MCU, the known solution is to place the MCU in a reset state, such that any over frequency clock does not cause adverse operation of the MCU. Typically, during this reset state 120, little current is drawn.

Thereafter, the waveform 100 illustrates a rapid increase in current drawn by the MCU up to its full operating current requirements 130 within a rise time of around one clock cycle 125, commonly a few nanoseconds. This occurs when reset is released and the MCU begins operation at a frequency, which may be many times that during the boot loader phase.

Thus, in order to accommodate for this potential for a rapid change in supply current to the MCU, designers typically 'over-design' the circuitry by incorporating a more expensive and increased performance power supply circuit, thereby ensuring the power supply remains within its stipulated specification during the MCU 'turn-on' operation. Although such a power supply is required to turn on the MCU, it is not required during maximum frequency operation. Therefore, the power supply is over designed for operating the MCU.

In particular, in over-designing the power supply circuit, the voltage regulator used to supply power to the MCU is commonly by nature slower than the MCU, such that it has insufficient time to catch up with the sudden increase in current demanded by the load. Therefore, this additional current typically emanates from the use of expensive and space consuming decoupling capacitors.

Thus, in recent years, a technique known as 'SoftStart' has been used to minimise such rapid changes in supply current.

A number of soft start procedures have been developed in the past, such as:
(i) A circuit defined by Clive Bolton in Electronic Design (ED Online ID #2481), which employs a programmable logic device (PLD) to control the start up of a regulator, by use of pulse width modulation (PWM);
(ii) US Patent Application US 20030156438 A1, which defines a soft-start circuit for a regulated power supply, implemented in a feedback circuit with a gradual start-up;
(iii) US Patent Application US 20020140463 A1, which also uses soft-start control for a power supply circuit, breaking the ramping of the output voltage into a series of discrete voltage ramp-up steps;
(iv) US Patent Application describes another power supply circuit implementing a gradual start-up, having a MCU using two operational amplifiers, used to limit the duty cycle of the power supply; and
(v) US Patent Application US 20030020442 A1 documents a current limiting technique for a switching power converter. This circuit slowly increases the switching duty cycle on power up.

Notably, the power source, such as a voltage regulator, dictates the power to be applied to the load in the aforementioned techniques. This is inappropriate for an MCU, because an MCU only operates within a specified and relatively narrow voltage range. Thus, gradual application of neither voltage nor current will permit the MCU to arrive at its maximum frequency of operation without transient effects, since in both cases the voltage will be too low for MCU operation during the majority of the voltage or current ramp.

Thus, a need has arisen to provide a method of initialising an electronic device, such as an application specific integrated circuit or a micro-controller, wherein the aforementioned disadvantages of known devices and methods for controlling current may at least be alleviated.

STATEMENT OF INVENTION

In accordance with embodiments of the present invention, there is provided an electronic device, an integrated circuit and a method of controlling current, as defined in the appended Claims.

Figure 1:
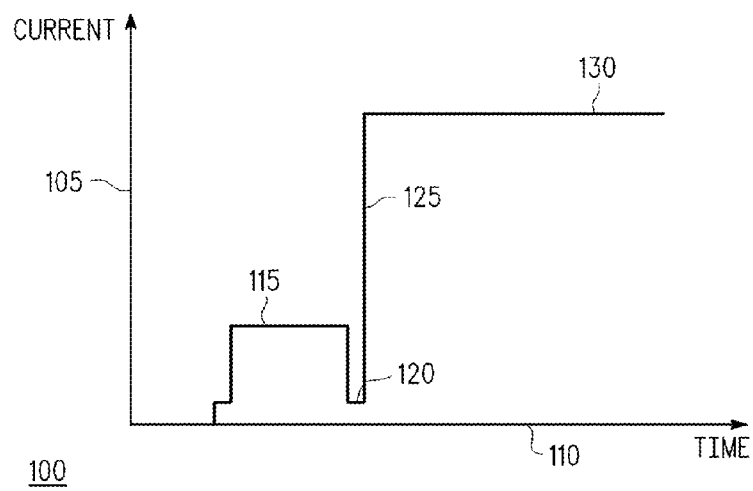
FIG. 1 illustrates a current versus time waveform of a known process for increasing an MCU current in an electronic device.
Figure 2:
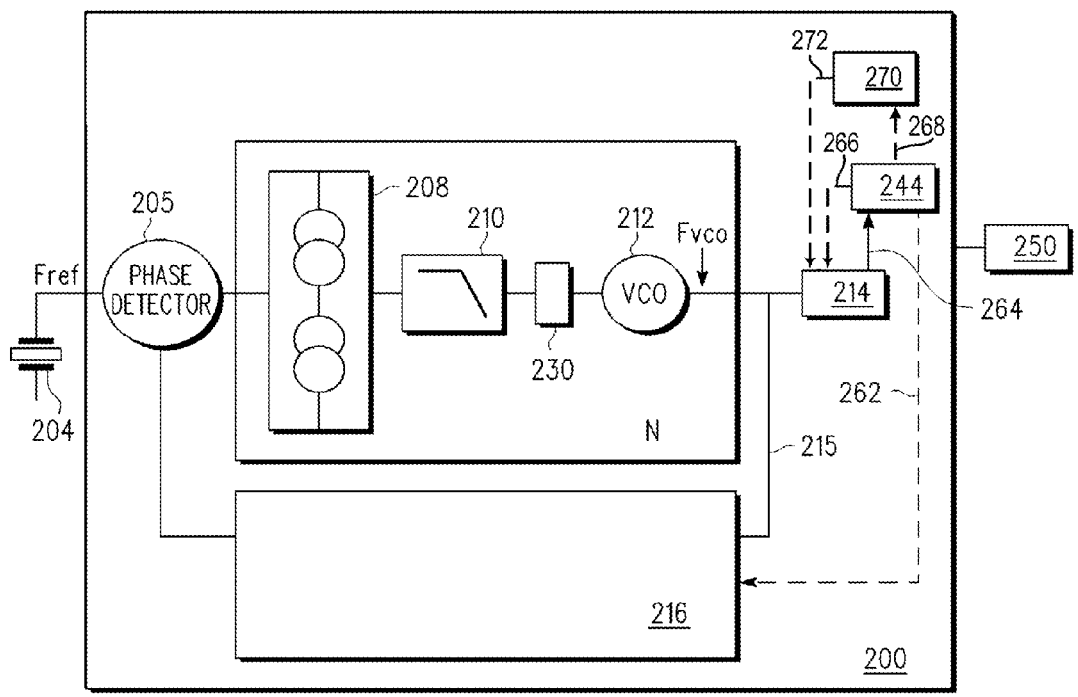
Figure 3:
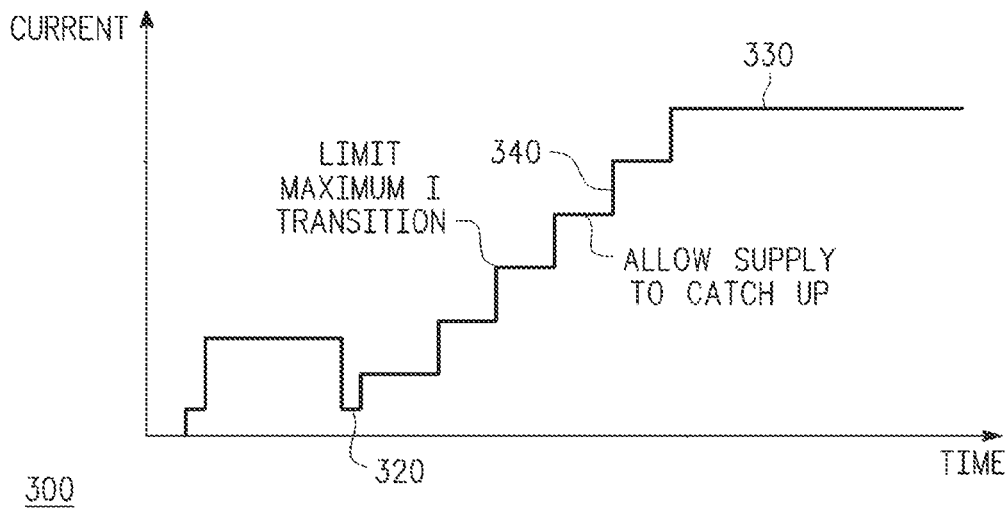
Figure 4:
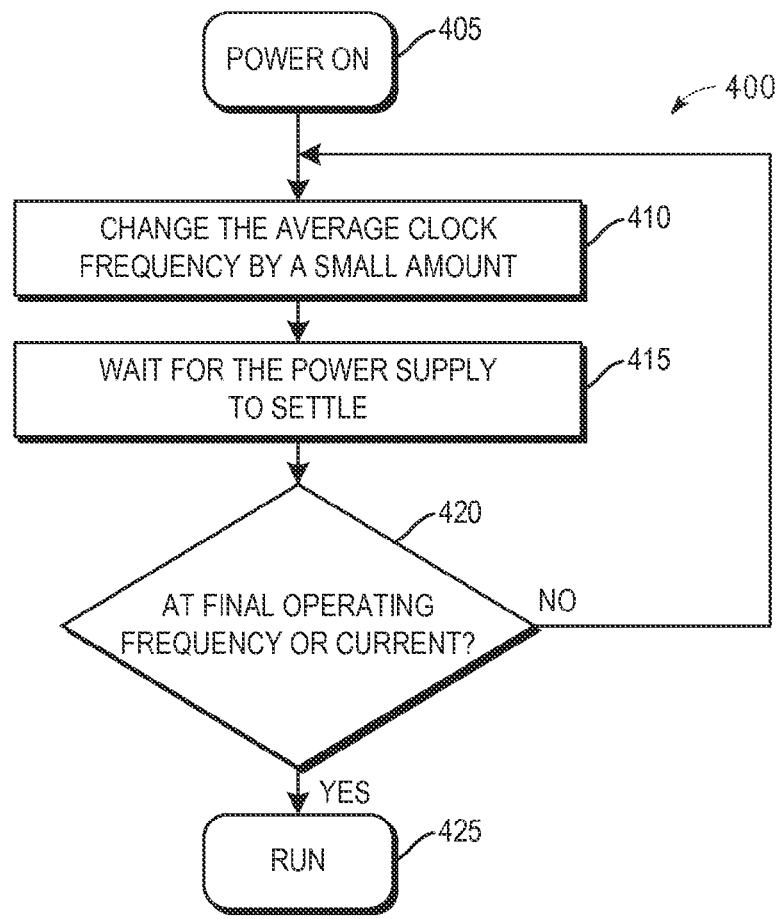
Figure 5:
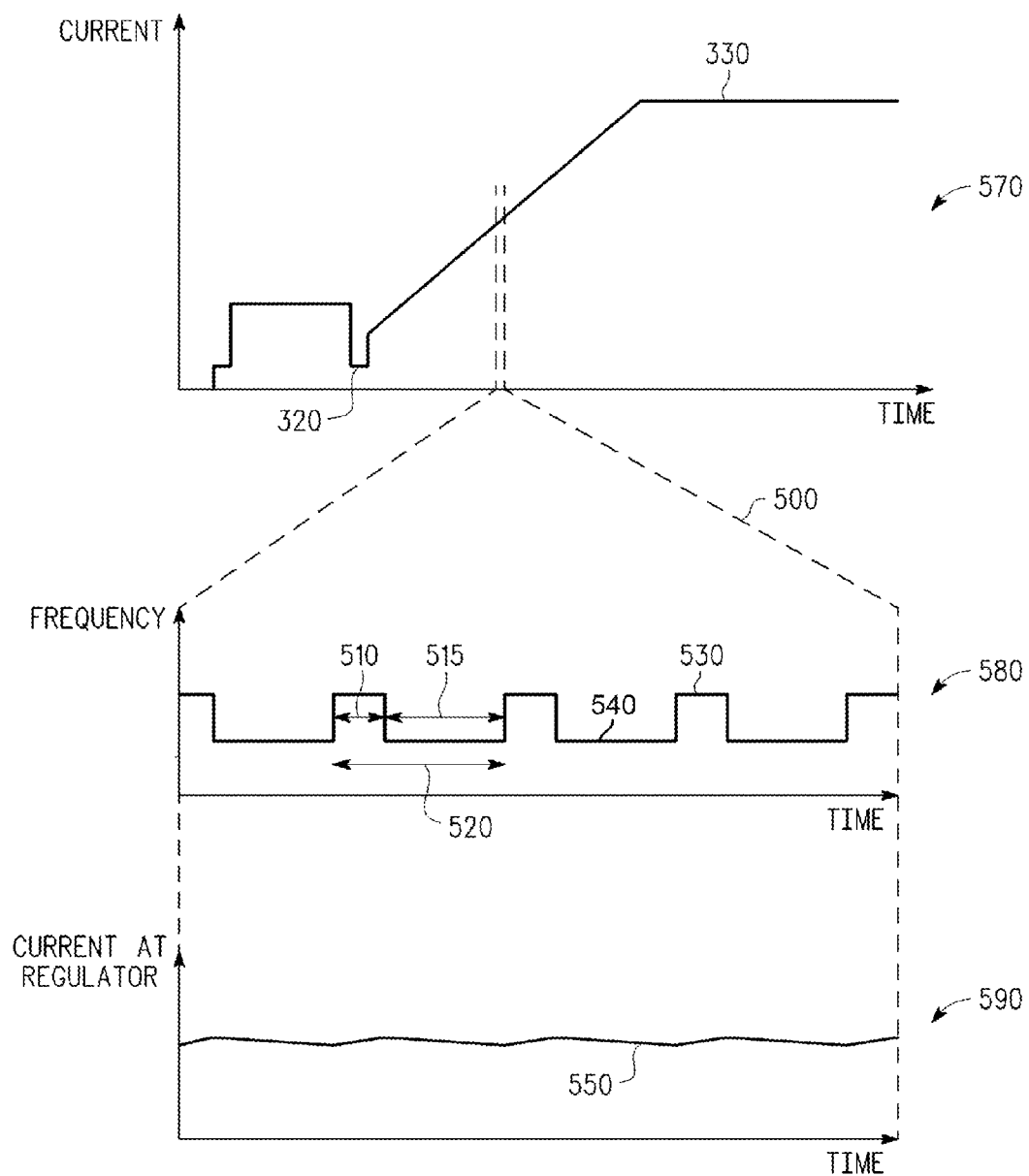

Exemplary embodiments of the present invention will now be described, with reference to the accompanying drawings, in which:

FIG. 2 illustrates a block diagram of a micro-controller and frequency/clock generation circuit of an electronic device operably coupled to a frequency generation circuit, adapted to support the various embodiments of the present invention;

FIG. 3 illustrates a waveform employed by the circuit adapted to support the embodiment of the present invention;

FIG. 4 shows a flowchart of a power-up process of an MCU according to an embodiment of the present invention; and FIG. 5 illustrates three waveforms, comprising an alternative embodiment of the invention; and two expanded views over a much shorter time period of this waveform.

DESCRIPTION OF EMBODIMENTS

In summary, the embodiment described hereinafter proposes to start the operation of a micro-controller unit (MCU) in a more controlled manner. In this regard, it is proposed that the MCU controls the current supplied to it. This approach is in direct contrast to the known techniques whereby current is ramped up or down, based solely on the perspective seen from the source, i.e. typically a voltage regulator, of the current level to be delivered to the load. Thus, in this manner, the MCU may be understood as behaving as an intelligent load to a power supply, where the intelligent load controls the current applied to the load (MCU).

A block diagram of an embedded micro-controller unit (MCU) 200 and frequency/clock generation circuit of an electronic device is shown in FIG. 2. The electronic device is adapted to support the embodiments of the present invention. The electronic device comprises a frequency generation circuit that comprises a phase locked loop (PLL) including a free-running crystal oscillator 204 that is arranged to provide an oscillator signal to a phase detector 205. The phase detector 205 detects the phase difference between the divided VCO output signal and the free-running crystal oscillator reference signal, as known in the art. The phase detector 205 outputs a signal to a charge pump 208, which introduces current into, or out of, a classic lead-lag loop filter 210, in proportion to the detected phase difference, as known in the art. The output from the charge pump 208 is filtered by loop filter 210 and input to a voltage-controlled oscillator (VCO) 212. The loop filter 210 is used to set the main loop dynamics, as well as filtering spurs, spikes, transients and/or noise.

In accordance with known PLL circuits, the phase locked loop arrangement further comprises a fractional 'N' synthesiser 216 operably coupling the VCO output signal to the phase detector 205, to maintain accurate phase control of the oscillator signal. In the feedback path, the fractional 'N' synthesiser 216 comprises a divider function operably coupled to a fractional-N controller. The fractional-N controller function is under control of the MCU controller 244, as indicated by control line 262. The VCO/PLL output signal is fed into a divider function 214, which produces the clock signals 264 used by the MCU controller 244. Notably, the divider function is capable of dividing the VCO output frequency 215 before it generates the general system clock signals.

Slewing the VCO is an optional hardware embodiment of the invention, so the delay function 230 is typically located between the filter 210 and the VCO 212. In this manner, the delay function acts upon the VCO as a slew rate limiter. It is envisaged that the delay function 230 may be incorporated using a simple counter when the VCO is digitally controlled. Also, typically, it is envisaged that the illustrated components and functions (apart from the regulator 250) are integrated onto an integrated circuit (IC).

In accordance with embodiments of the present invention, the MCU controller 244 adjusts the current provided to the MCU controller 244 from the voltage regulator 250 by adjusting its own operating frequency.

Advantageously, the current drawn by the device is proportional to the clock frequency. Hence, the techniques proposed below increase the current drawn from the voltage regulator 250 in a slow and controlled manner, thereby avoiding pulling the power supply (voltage regulator 250) outside of its voltage tolerance.

Thus, upon initialising of an electronic device, the MCU is configured to set an initial low clock frequency of the PLL circuit, provided to the MCU, and ramp up the clock rate gradually. Thus, in accordance with one embodiment of the present invention, the MCU and associated frequency/clock generation circuit have been adapted to increase the clock rate slowly, particularly upon start-up of the electronic device and/or initialising of the MCU controller 244.

Referring now to FIG. 4, a flowchart 400 illustrates the preferred general mechanism for ramping-up current in a start-up operation suitable for, say, an MCU. The process starts with the electronic device being turned 'on' in step 405. The MCU then makes an adjustment to the average clock frequency, as shown in step 410. In one embodiment, the MCU then waits for the power supply (i.e. the voltage provided by the regulator) to settle, as in step 415. The MCU then determines whether the frequency of operation is the final operating frequency required to operate the MCU, as shown in step 420. If the determined frequency is the final operating frequency required to operate the MCU, in step 420, the MCU then exits the power up phase and commences its main task in step 425. If the final operating frequency required to operate the MCU is not yet reached, in step 420, the process loops back to step 410 and increases the average clock frequency by a small amount again. This process continues and the frequency increases until it reaches the final operating frequency required by the MCU. Alternatively, step 420 proceeds by determining by the processor load, whether the current provided is a final operating current, and repeating the steps of adjusting, providing and determining until the current level reaches the final operating current.

The purpose of this process flow is to increase the load seen by the power supply gradually, such that the voltage remains within required limits. It will be appreciated by those skilled in the art that although a discrete step process is described, any step size that can be accommodated by the regulator may be used at any point, including infinitesimally small step sizes, as may be the case with an analogue frequency ramp.

There are three proposed techniques to increase the clock rate slowly (although a skilled artisan will appreciate that other techniques may be employed), which may be used in isolation or in combination:

(i) In a first embodiment, the MCU controller 244 controls (via control line 266) the dividing function 214, of the PLL clock during a ramp-up operation, such that the ramp-up current is performed in a series of intermittent steps, as shown below with respect to FIG. 3. In this manner, by configuring the MCU 200 to be able to control the generation of clock signals, without affecting PLL lock, the MCU 200 is able to control the clock frequency provided to the MCU 200.

This mechanism is effective if the frequency of the VCO is significantly higher than the desired operating frequency of the MCU, and the mechanism can be used when the MCU must be held in reset whilst the PLL locks. To initialise this mechanism, firstly the dividing function 214 is set on reset to a high number, to produce a low frequency of operation of the MCU 200. The selection of a frequency/clock rate to be used in such an arrangement is important, as starting at too high a frequency fails to resolve the original problem and may cause problems to the power supply operation. This is resolved using a high default value of the divide function in the dividing function 214.

Next the fractional divider 216 would be set such that the VCO locks to a frequency, preferably significantly above the desired final operating frequency of the MCU. Accordingly the MCU is now in a suitable condition to commence gradual increase of its operating frequency through progressive reduction of the value of the dividing function 214. Each reduction causes a step increase of the current (from its initial value 320 to its maximum value 330 by step 340 as shown in FIG. 3), which is designed to be within the capability of the decoupling capacitors for the regulator 250. The new operating frequency is then held for a period sufficient to permit the regulator to recover nominal voltage again, whence the next step is undertaken.

(ii) A second mechanism increases the clock frequency in a 'clock slewing' manner. In this regard, the clock slewing may use pulse width modulation (PWM) of the dividing function to take the average clock frequency from a first value to a second value in a gradual controlled manner.

This mechanism is described with reference to FIG. 5, where waveforms 580 and 590 represent a very short timescale compared to waveform 570. Initialisation of this mechanism may be similar to the first mechanism, resulting in a PLL frequency at, or above, the desired operating frequency 530 of the MCU, with the dividing function reducing this to a low starting frequency 540 of actual operation of the MCU 200.

The PWM mechanism includes a pulse width modulation (PWM) circuit 270 operably coupled to the MCU controller 244 by a ulse width modulation PWM control line 268 and to the dividing function 214 by a pulse width modulated (PWM) signal 272. The PWM mechanism further comprises a repetitive period 520 with two component times 510 and 515. During the first component time 510 the MCU controller 244 reduces the value of the dividing function (via the PWM control line 268 operablv coupled to the PWM circuit 270, which in turn is operably coupled to the dividing function 214 by PWM signal 272) such that the MCU 200 now operates at a higher frequency, and therefore current.

However, a brief time later, the MCU controller 244 returns the value of the dividing function back to its previous value (via the PWM control line 268 and PWM circuit 270). This returns the MCU current back to the original level. This is held for a brief time 515 before the cycle repeats. By making the period 520 short enough, typically in the range of nanoseconds or microseconds, the regulator 250 does not respond to the two discrete current levels, but to the average over the whole switching event, as shown by the waveform of current at the regulator 550.

Experimentation has shown that it is possible to remove the effect of the power surge incurred when changing frequency. Preferably, switching has to occur prior to, or within, the voltage overshoot period of the regulator, to prevent a problematic surge of current. That is, the frequency and current are returned to the prior values before the regulator 250 has time to respond. By changing the ratio of the period 510 of high frequency to the period 515 of low frequency, the average frequency, and hence average current drawn, can be varied.

This allows the current to ramp up from the initial value 320 to its maximum value 330, as shown, without any surges. For example, the increase in current could be increased in a staggered manner, for limited periods of time, according to a timer control. The activation of an increase in current would therefore be controlled by a pulse width modulated (PWM) signal 272 such that the current repeatedly increases and then stabilises according to the duty cycle of the PWM signal 272.

Alternatively, the duty cycle may be varied smoothly and slowly to create a smooth current ramp.

(iii) A third mechanism proposes a hardware limited slewing method. In this regard, the clock frequency is increased gradually by limiting a rate of change using hardware, for example of a current controlled oscillator (ICO) value, or alternatively via the fractional divide function.

As in the previous embodiments, the PLL powers up with a low default frequency. In such hardware slew embodiments, the microcontroller 200 is not held in a reset state if the PLL is unlocked. Advantageously, this enables the PLL circuit to be adjusted whilst code is running. Furthermore, using hardware slewing, fine control of the current increase can be achieved. In some embodiments, this may remove a need to use PWM frequency switching.

The PLL controller 244 commands of the PLL that it raise the frequency, typically through adjustment of the fractional divide ratio 216. However, the rate at which an ICO may change frequency is limited, such that the rate of change of current is within the capability of the regulator 250.

This limiting might be external to the ICO itself, or may comprise a mechanism to limit the rate of change of the loop filter 210. Alternatively, it may require a limit on the current capability of the charge pump 208. A yet further alternative may be to implement the limit through stepping of ranges of the ICO, or the fractional divide ratio 216.

If the PLL is a digital design, then the limit may be implemented as a rate of change of a digital value, for example that feeding a digital to analogue converter that controls the ICO. Similar mechanisms may be used should the PLL be based upon a Voltage Controlled Oscillator (VCO).

It will be appreciated by those skilled in the art that the exact mechanism for frequency rate limitation depends upon the architecture of the particular PLL. Further, it will be appreciated that different mechanisms may produce an increase in current of the pattern of FIG. 3, FIG. 5 or any combination thereof. The result will, however, be common—a controlled increase in frequency sufficiently slow that the regulator 250 is able to maintain voltage limits as the load current increases.

In this manner, the voltage from a voltage regulator and applied to the MCU is fixed, whilst the current provided to the MCU is accurately adjusted by the MCU in a controlled manner.

In an enhanced embodiment of the present invention, the MCU 244 is also arranged to monitor the frequency of the crystal being used to generate the electronic device's frequency/clock rates, as different crystal frequencies will require different multiply/divide factors. In this manner, the MCU is better able to set the rate of increase of its supply current at an optimum rate by controlling its frequency of operation.

Thus, with the present invention, the clock frequency is no longer increased to its 'operating' value as quickly as possible, in contrast to known MCU start-up operations. Thus, there is no longer a huge current transient on power-up or reset of the MCU. Therefore, the power supply remains within the desired specification and the need for expensive decoupling capacitors, in order to provide the extra (and excessive) current, is removed.

Notably, the proposed systems ensure that the load element that requires current, such as an MCU, behaves as an intelligent load and controls its own supplied power in response to its needs. This approach is in direct contrast to the known techniques whereby the source (voltage regulator or other controller) dictates the current applied 'to' a 'dumb' load, even when the load is the MCU.

Although the present invention has been described with reference to start-up of an MCU, it is envisaged that the embodiments described are equally applicable to any clocked product (particularly high frequency digital logic devices) where surges in start-up current are to be avoided.

The various components within the electronic device may be realised in discrete or integrated component form. Therefore, it is within the contemplation of the invention that the electronic device may be any clocked electronic circuit, such as a Microcontroller (MCU), digital signal processing device (DSP), Application specific integrated circuit (ASIC) or other large scale integrated (LSI) circuit.

The invention is therefore applicable to any electronic device using such circuitry, such as a mobile phone, a personal digital assistant, a laptop computer, automotive control units, etc.

Whilst specific and preferred implementations are described above, it is clear that one skilled in the art could readily apply variations and modifications of such embodiments.

Thus, an electronic device with a micro-controller, a method for controlling a current applied to a load such as an MCU, for example in initialising a MCU operation, and an integrated circuit therefor, have been provided where the disadvantages described with reference to prior art arrangements, circuits and methods have been substantially alleviated.

The invention claimed is:

1. An electronic device comprising:
 a voltage regulator and a frequency/clock generation circuit operably coupled to a processor load, the voltage regulator to supply a current to the processor load, wherein
 the processor load is further configured to:
 control the current drawn from the voltage regulator by an adjustment of the frequency/clock generation circuit,
 determine whether the current supplied to the processor load is a final operating current, and
 repeat the adjustment until the processor load determines that the current supplied has reached the final operating current.

2. An electronic device according to claim 1 wherein the current provided by the voltage regulator to the processor load is controlled upon start-up of the electronic device.

3. An electronic device according to claim 1 wherein the electronic device comprises one or more of: a micro-controller unit, a digital signal processor, an application specific integrated circuit, and other embedded controller.

4. An electronic device according to claim 3 wherein the processor load is operably coupled to a frequency/clock generation circuit and controls the current supplied to the electronic device by adjusting a frequency of operation of the electronic device.

5. An electronic device according to claim 4 wherein the frequency/clock generation circuit is a phase locked loop circuit, wherein the electronic device is arranged to control a dividing function of a PLL clock signal to adjust its frequency of operation.

6. An electronic device according to claim 5, wherein the electronic device is arranged to monitor an operating frequency of the frequency/clock generation circuit used to generate the electronic device's frequency/clock rates and adjust a frequency of operation of the electronic device in response thereto.

7. An electronic device according to claim 4, wherein a dividing function of the frequency/clock generation circuit is initially set on reset to a high value, to produce a low frequency of operation of the electronic device.

8. An electronic device according to claim 7 wherein an operating frequency of the electronic device is increased through reduction of the value of a dividing function.

9. An electronic device according to claim 8 further characterised by a pulse width modulation circuit operably coupled to the frequency/clock generation circuit to generate a pulse width signal to be applied to the frequency/clock generation circuit to vary an average frequency of operation of the electronic device.

10. An electronic device according to claim 9 wherein the electronic device changes a pulse width ratio of the pulse width signal to vary the average frequency of operation of the electronic device.

11. An electronic device according to claim 4 wherein the electronic device controls the clock frequency by limiting a rate of change of a current controlled oscillator value or voltage controlled oscillator value.

12. An electronic device according to claim 4 wherein the processor load controls the current supplied to the electronic device in a series of intermittent steps.

13. A method of controlling a current supplied to a processor load in an electronic device having a voltage regulator operably coupled to a frequency/clock generation circuit, wherein the method comprises the following steps:
 adjusting by the processor load an average clock frequency of the frequency/clock generation circuit;
 providing current to the processor load in response to the adjusted clock frequency;
 determining by the processor load, whether the current provided is a final operating current; and
 repeating the steps of adjusting, providing and determining until the current level reaches the final operating current.

14. The method of controlling a current supplied to the processor load according to claim 13, wherein the processor load is one or more of: a micro-controller unit, a digital signal processor, an application specific integrated circuit, and other embedded controller.

15. The method of controlling a current supplied to the processor load according to claim 14 further characterised by an intermediate step of waiting, by the electronic device, for the supplied current to settle before determining whether the current provided is a final operating current.

16. An electronic device comprising:
 a voltage regulator operably coupled to a processor load to supply a current to the processor load; and
 a frequency/clock generation circuit operably coupled to the processor load that comprises one or more of the group consisting of:
 a micro-controller unit; a digital signal processor; an application specific integrated circuit; and an embedded controller,
 wherein the frequency/clock generation circuit is arranged to adjust a frequency of operation of the electronic device using a hardware clock slewing approach;
 wherein the micro-controller unit is configured to:
 determine whether the frequency of operation supplied to the micro-controller unit is a final operating frequency to operate the micro-controller unit, wherein the currrent provided to the processor load is proportional to the frequency of operation; and cause the frequency/clock generation circuit to repeat the adjustment of the frequency of operation until the frequency of operation supplied to the micro-controller unit has reached the final operating frequency.

17. The electronic device of claim 16 wherein the frequency/clock generation circuit comprises a current controlled oscillator arranged to limit a rate of change of a clock slew rate.

18. The electronic device of claim 16 wherein the frequency/clock generation circuit comprises a voltage controlled oscillator operably coupled to a filter delay function, wherein the filter delay function is arranged to act upon the voltage controlled oscillator as a slew rate limiter.

19. The electronic device of claim 18 wherein the filter delay function is a digital counter for digitally controlling the voltage controlled oscillator or a current controlled oscillator.

\* \* \* \* \*